US006639431B1

(12) United States Patent
Potter

(10) Patent No.: US 6,639,431 B1
(45) Date of Patent: Oct. 28, 2003

(54) DIFFERENTIAL INPUT COMPARATOR

(75) Inventor: Dale A. Potter, Beaverton, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 10/112,370

(22) Filed: Mar. 29, 2002

(51) Int. Cl.[7] .............................................. H03K 5/22
(52) U.S. Cl. ........................................ 327/65; 330/253
(58) Field of Search ............................. 327/65, 63, 55, 327/67; 330/253

(56) References Cited

U.S. PATENT DOCUMENTS

| | | | | |
|---|---|---|---|---|
| 5,990,743 A | * | 11/1999 | Gabara ........................ 330/258 |
| 6,304,141 B1 | * | 10/2001 | Kennedy et al. ............. 330/253 |
| 6,380,805 B1 | * | 4/2002 | Bily et al. .................... 330/253 |
| 6,411,132 B2 | * | 6/2002 | Griffin .......................... 327/65 |

* cited by examiner

Primary Examiner—Toan Tran
(74) Attorney, Agent, or Firm—Klarquist Sparkman, LLP

(57) ABSTRACT

A comparator circuit is disclosed that senses a differential input polarity even when operating with a common mode voltage near the power rails (e.g., 50 millivolts) and under a wide range of process, temperature, and power supply conditions. In one aspect, the comparator circuit uses a complementary pair of P-type and N-type differential amplifiers. A combined P-type and N-type differential amplifier provides good transconductance even with a common mode voltage near either voltage rail. Consequently, a larger current swing than prior art circuits is provided to a current-to-voltage converter, which results in an overall faster circuit. In another aspect, a bias circuit drives a source follower that biases transistors in the differential amplifiers to ensure high transconductance and, consequently, high gain. Thus, the disclosed comparator senses differential input polarity even with a common mode voltage of only 50 millivolts or less.

23 Claims, 5 Drawing Sheets

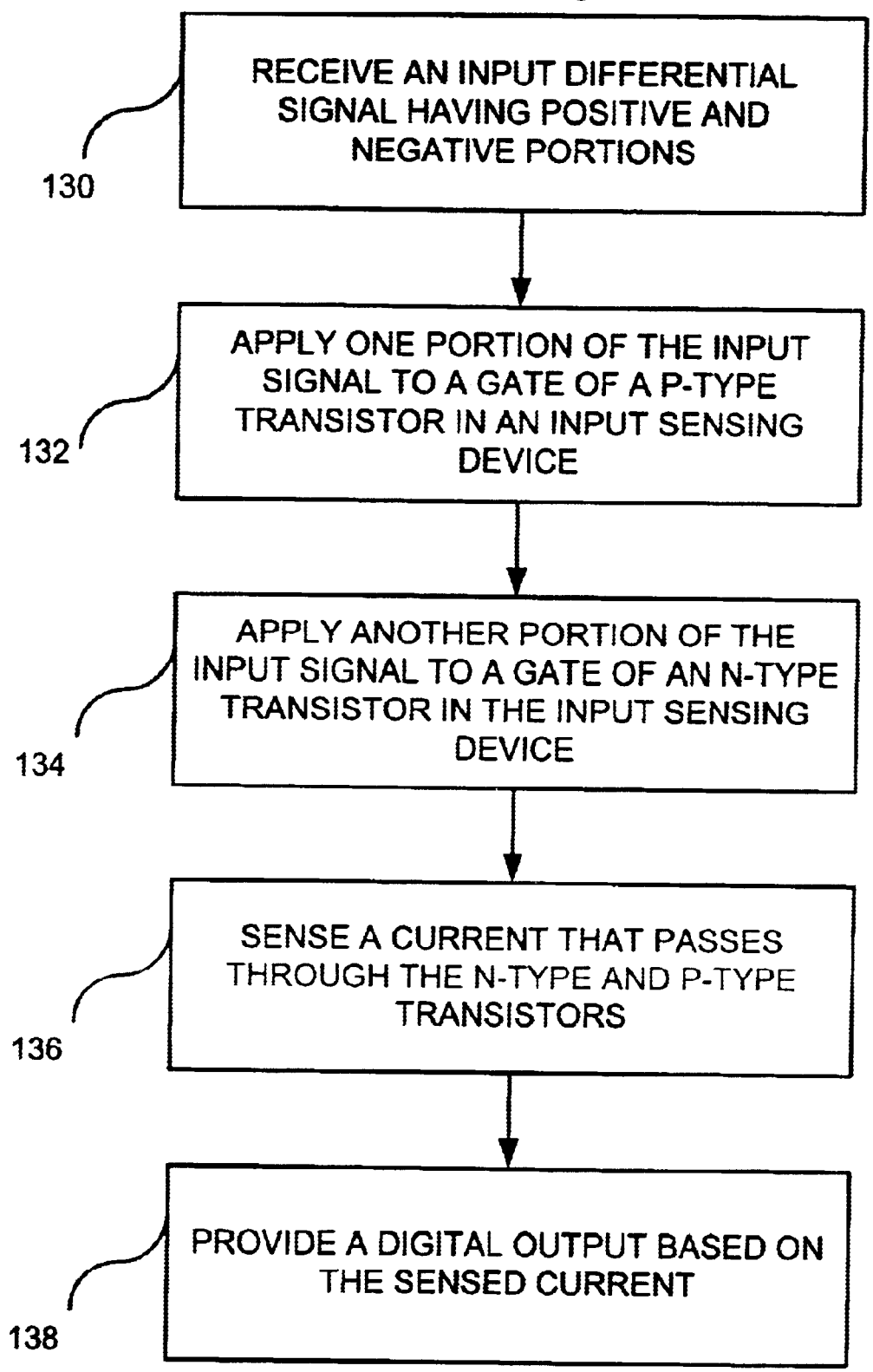

DIFFERENTIAL INPUT COMPARATOR

FIELD

The present invention relates generally to integrated circuits, and more particularly to integrated circuits using differential input comparators.

BACKGROUND

Integrated circuits (ICs) typically use input translators to ensure voltage levels received on input pins are brought to proper voltage levels for use in the ICs. For example, input translators are used in CMOS integrated circuits to convert TTL voltage-level signals to CMOS voltage-level signals.

For applications that require more sensitivity and noise immunity input comparators are used in place of input translators to receive input signals. Such comparators receive a two-input differential signal and analyze the difference between the inputs. Based on the difference between a Vin+ input and a Vin− input, a digital signal is provided to the core logic in the IC. Input comparators are especially effective for receiving low voltage swing, high-speed signals.

One characteristic of differential signals is called a common mode voltage, which is a voltage level midway between the differential input signals. Existing comparator designs lose differential voltage gain when the common mode voltage is within 200 to 300 millivolts of either supply rail. However, today's specifications require that the allowable common mode voltage range be up to 50 millivolts from the supply rails.

An example prior art differential input comparator 10 is shown in FIG. 1. The input comparator has two inputs Vin+ and Vin−. The prior art comparator includes a P-channel differential amplifier 12 and an N-channel differential amplifier 14, each shown in dashed lines. The P-channel differential amplifier 12 includes two P-channel transistors 16, 18 and a current bias circuit 20. The N-channel differential amplifier 14 includes two N-channel transistors 22, 24 and a current bias circuit 26. The differential amplifiers 12, 14, are used to generate currents Ia, Ib, Ic, and Id, having current levels associated with the input signals Vin+ and Vin−. The currents Ia, Ib, Ic, and Id, are fed into a current adder/subtractor circuit 30 that performs the function (Ib+Ic−Ia−Id). A transresistance amplifier 32 receives the output of the adder/subtractor circuit 30 and provides a digital signal to the integrated circuit designated as Vout. FIG. 2 shows the prior art circuit 10 of FIG. 1 in greater detail.

It is desirable for this prior art circuit 10 to have all four transistors 16, 18, 22, 24 with non-zero current values to achieve maximum sensitivity. However, near the voltage rails, one of the differential amplifiers 12, 14 nearly turns off, impairing the circuit's sensitivity. For example, with a common mode near the positive voltage rail, the currents Ia and Ic are very low because the P-channel differential amplifier nearly turns off, while Ib and Id are high because the N-channel differential amplifier is on. However, with only half of the circuit effectively functioning, the overall sensitivity is impaired. Likewise, with a common mode voltage near the negative voltage rail, only the P-channel differential amplifier 12 has substantial current flow, while the N-channel differential amplifier 14 nearly shuts off. Again, the overall sensitivity of the circuit is impaired because only half of the circuit 10 is effectively contributing to the analysis.

Thus, prior art circuits fail with more recent requirements that circuits operate with common mode voltages near the voltage rails.

SUMMARY

A comparator circuit is disclosed that senses a differential input polarity even when operating with a common mode voltage near the power rails (e.g., 50 millivolts from a power rail) and under a continuous, wide range of process, temperature, and power supply conditions.

In one aspect, the comparator circuit uses a complementary pair of P-type and N-type differential amplifiers. A combined P-type and N-type differential amplifier provides good transconductance even with a common mode voltage near either voltage rail. Consequently, a larger current swing than prior art circuits is provided to a current-to-voltage converter, which results in an overall faster circuit with increased sensitivity.

In another aspect, a voltage bias circuit drives a source follower that biases transistors in the differential amplifiers to ensure high transconductance and, consequently, high gain.

Thus, the disclosed comparator senses differential input polarity even with a common mode voltage of only 50 millivolts or less. The circuit also only adds a small number of transistors compared to prior art comparator designs. However, the additional transistors may allow other transistors to be scaled down so that the overall die area remains substantially unchanged.

These and other aspects and features of the comparator circuit are described below with reference to the accompanying drawings.

BRIEF DESCRIPTION OF DRAWINGS

FIG. 6 is a flow chart of a method for sensing a differential input.

DETAILED DESCRIPTION

Figure 3:
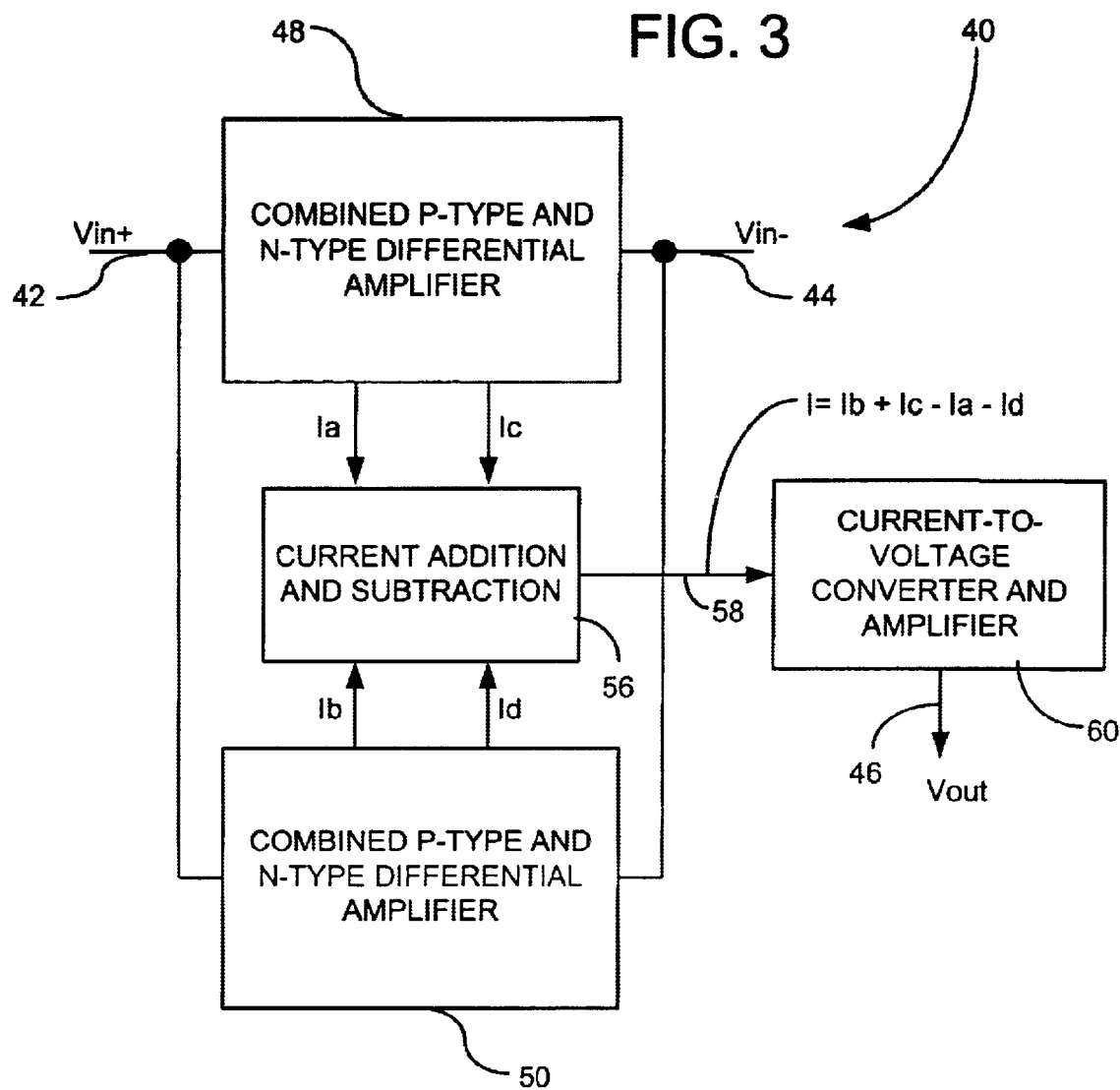
FIG. 3 is a high-level block diagram of a comparator circuit according to the invention.

FIG. 3 shows a comparator circuit 40 with high sensitivity, even for common mode voltages near the positive and negative voltage rails. The comparator circuit 40 has differential inputs shown as Vin+ 42 and Vin− 44. The circuit provides a digital output voltage Vout 46 that is either high or low, depending on the difference between the voltages Vin+ and Vin−. The comparator 40 has two differential amplifiers, 48, 50, that include both P-type and N-type transistors. Because the differential amplifiers 48, 50 include both P-type and N-type transistors, they are designed to function and provide current output regardless of the common mode voltage. Differential amplifier 48 provides two current outputs, Ia and Ic based on the differential inputs Vin+ 42 and Vin− 44. Similarly, differential amplifier 50 provides two current outputs indicated as current Ib and Id, based on the differential inputs. A current-addition-and-subtraction circuit 56 receives the currents Ia, Ib, Ic and Id and combines the currents in a predetermined manner to provide a single current output 58. In the illustrated embodiment, the currents are combined in accordance with the formula I=Ib+Ic−Ia−Id. A current-to-voltage converter and amplifier 60 is used to convert the current 58 to the digital output 46.

Figure 1:
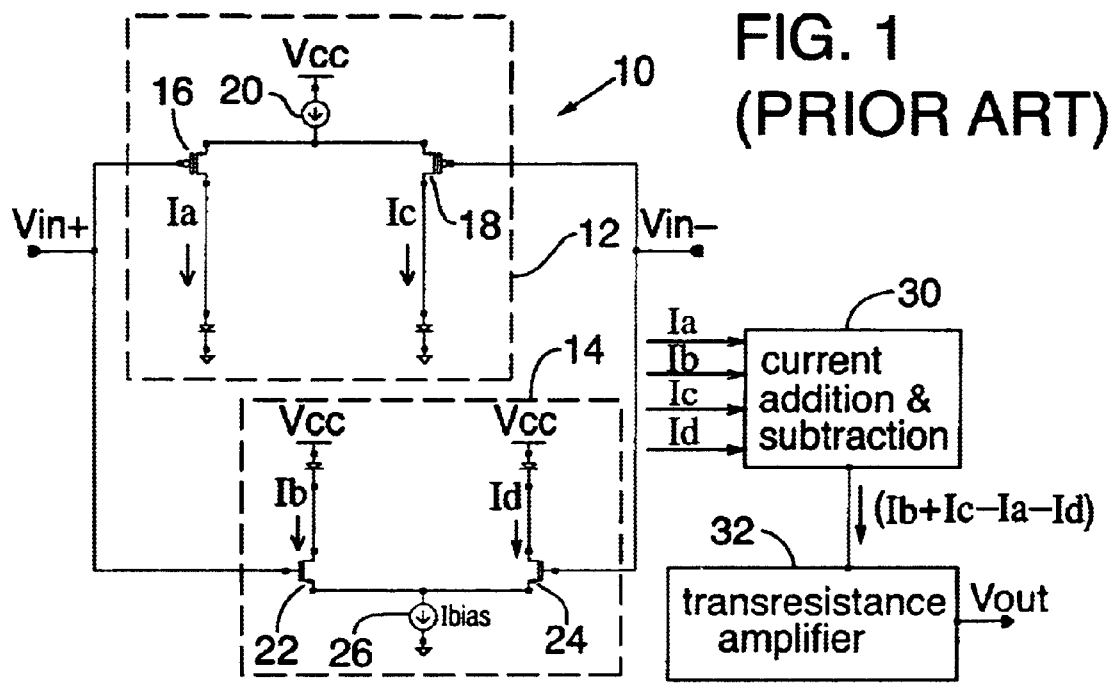
FIG. 1 is a high-level circuit diagram of a prior art comparator.
Figure 4:
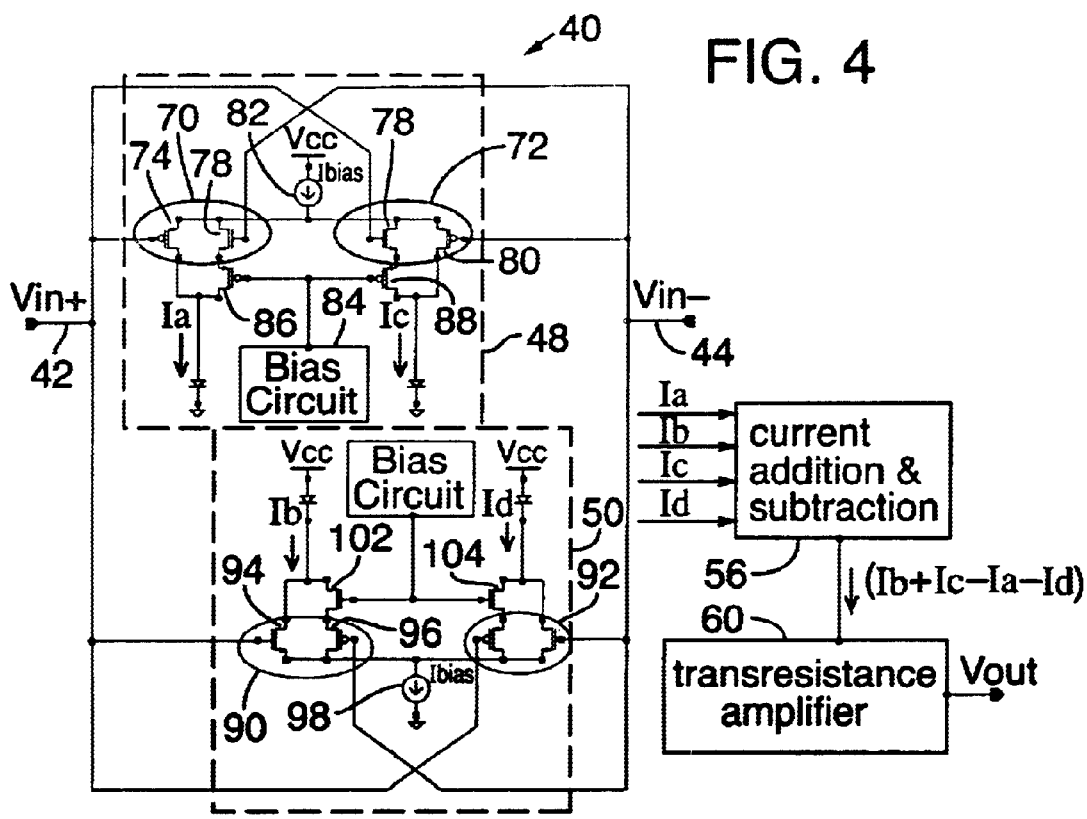
FIG. 4 is one embodiment of the comparator circuit of FIG. 3.
Figure 2:
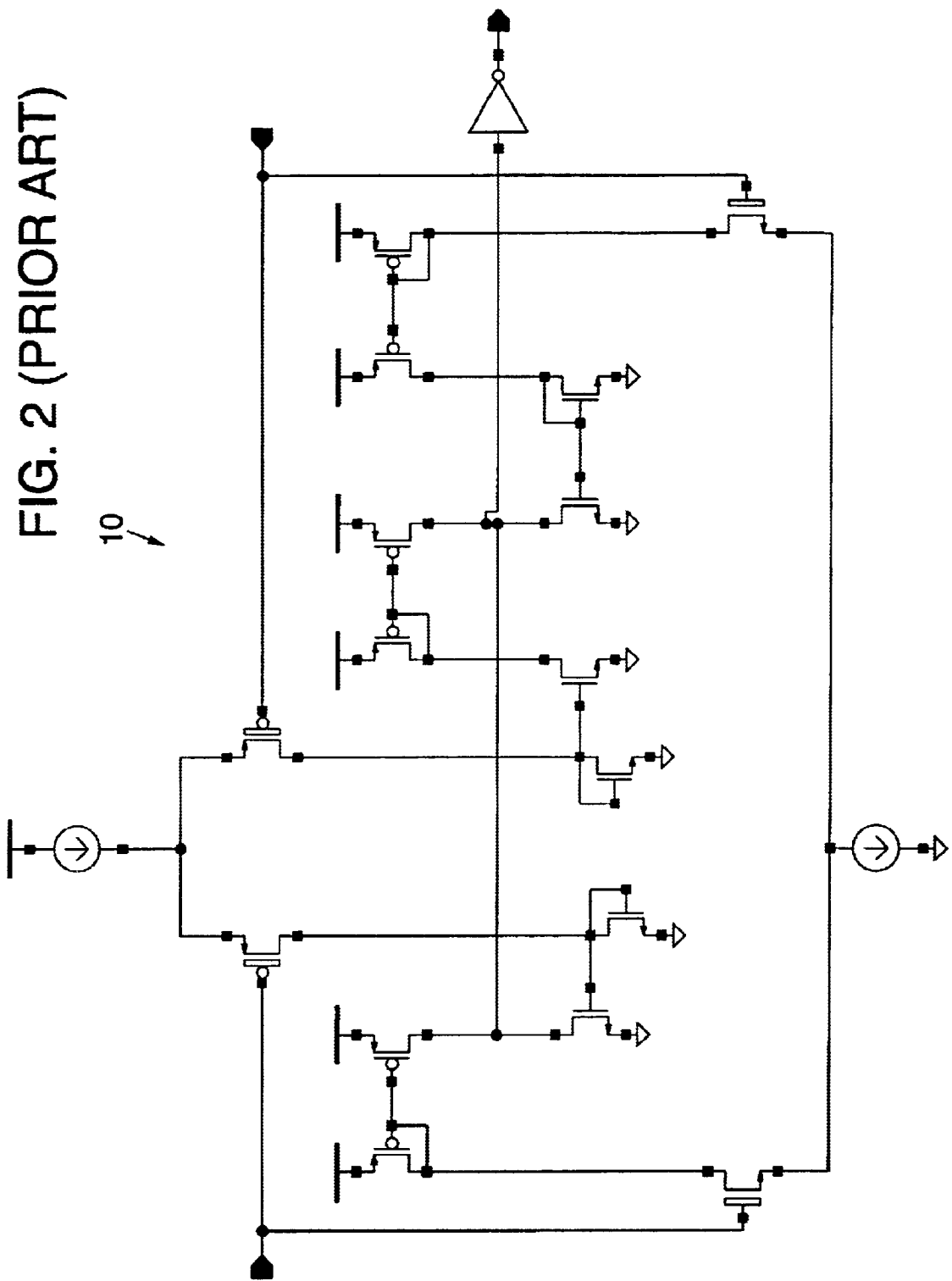
FIG. 2 is a detailed circuit diagram of the prior art comparator of FIG. 1.

FIG. 4 shows one possible embodiment of the comparator circuit 40 of FIG. 3. The two differential amplifiers 48, 50 are shown in dashed lines. The differential amplifier 48 includes two complementary input sensing devices 70, 72. Sensing device 70 includes a P-type transistor 74 and an N-type transistor 76. The P-type transistor 74 has its gate connected to the Vin+ input terminal 42, while the N-type transistor 76 has its gate connected to the Vin− input terminal 44. Likewise, input sensing device 72 has two transistors 78 and 80. Transistor 80 is a P-type transistor with its gate connected to the Vin− input terminal 44 and transistor 78 is an N-type transistor with its gate coupled to the Vin+ input terminal 42. The differential amplifier 48 also includes a current bias circuit 82, such as a current mirror, a voltage bias circuit 84, and two source following transistors 86, 88. The input transistors are generally coupled in parallel with the source of one transistor coupled to the drain of the other transistor. The bias circuit 84 provides a constant voltage to the gates of the P-type transistors 86, 88. As a result, transistors 86, 88 have a constant voltage on their sources, which increases the transconductance (the resulting change in current divided by a given change in gate voltage) of the N-channel transistors 76, 78.

The sensing devices 70 and 72, each have complementary N- and P-type transistors coupled in parallel to opposing sides of the differential input 42, 44. This complementary configuration allows adequate current flow regardless of whether the common mode voltage is near the negative voltage rail or the positive voltage rail.

Differential amplifier 50 has a similar structure to that described in differential amplifier 48. The differential amplifier 50 includes complementary sensing devices 90 and 92. Sensing device 90 includes N-type transistor 94 and P-type transistor 96. The differential amplifier 50 is complementary to differential amplifier 48 because the source-following transistors 86, 88 are P-type in differential amplifier 48, while the source-following transistors 102, 104 are N-type in differential amplifier 50. The differential amplifier 50 also includes two bias circuits 98 and 100. As described above, the bias circuit 98 is a current bias circuit, such as a current mirror, and bias circuit 100 is a voltage bias circuit to provide a constant voltage to source following transistors 102 and 104. The circuit 40 also includes current-addition-and-subtraction circuit 56 and the current-to-voltage converter and amplifier 60 (shown as a transresistance amplifier).

Figure 5:
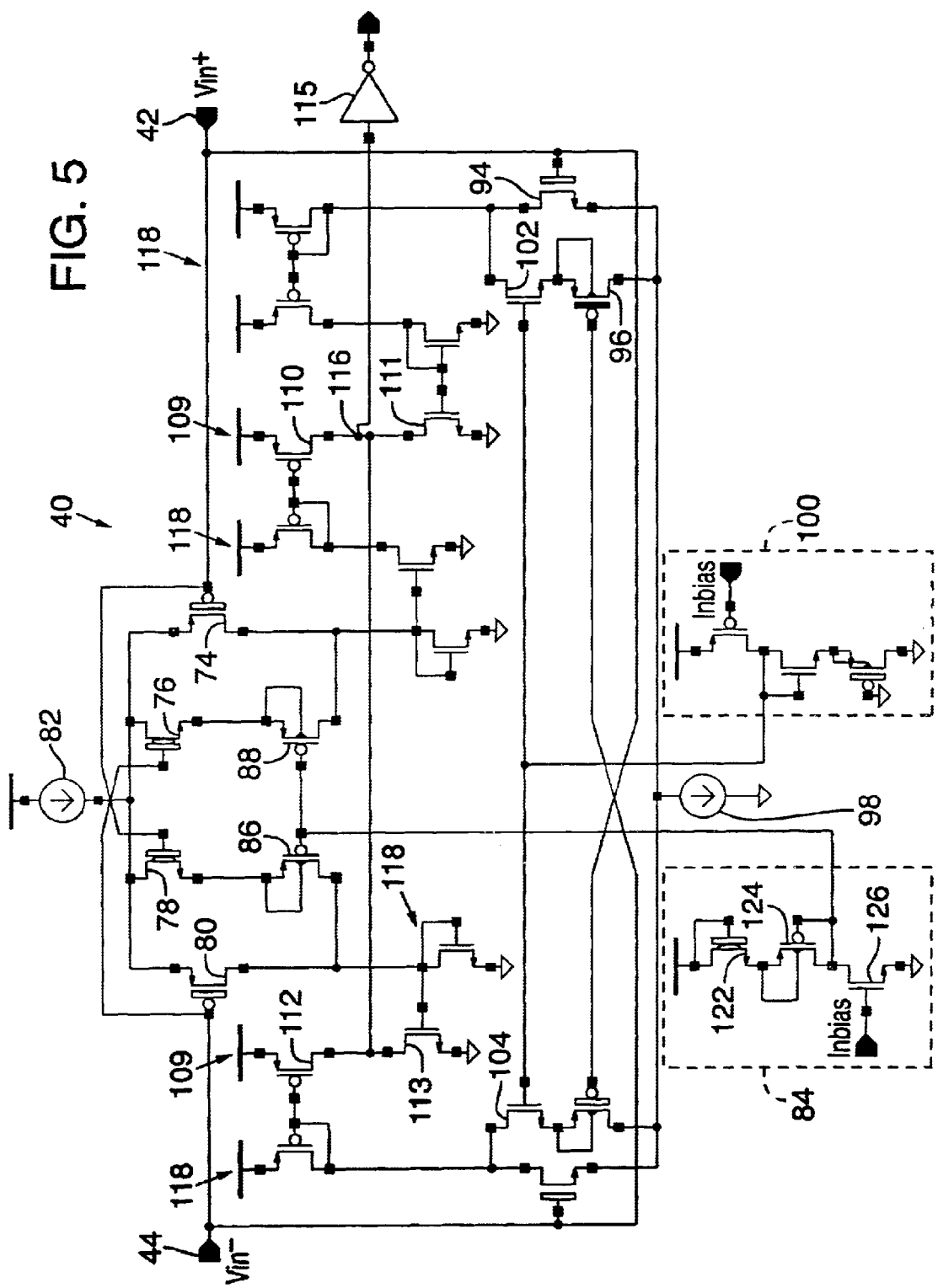
FIG. 5 is a detailed circuit diagram of the comparator circuit of FIG. 4.

FIG. 5 shows a further detailed circuit diagram for the comparator circuit of FIG. 4. Many of the transistors in this circuit have numbers corresponding to those of FIG. 4 (note that FIG. 5 has transistors 86 and 88 reversed with respect to FIG. 4.). However, further details are given for the current-addition-and-subtraction and transresistance amplifier and the voltage bias circuits. For example, the current-addition-and-subtraction and part of the transresistance amplifier is generally shown at 109 and includes transistors 110, 111, 112 and 113, which combine the currents together and produce a resultant voltage at node 116. Current mirrors, shown generally at 118, mirror the currents Ia, Ib, Ic and Id to the addition and subtraction and transresistance amplifier 109. The voltage amplifier 115 (which is also part of the transresistance amplifier) is shown as a simple inverter, but other amplifiers may be used. Those skilled in the art will recognize that the amplifier can be any component which has enough voltage gain to produce a full rail output.

It may be desirable to include in the circuit 40 some transistors that have a lower voltage threshold. Transistors with a lower voltage threshold turn on at a slightly lower gate voltage than more traditional transistors, which helps improve their transconductance when it is most needed—when the input common mode approaches a power rail. For example, transistors 76 and 78 are shown as transistors with a lower voltage threshold as indicated by the lines between the gate and the channel area of the transistor. It should be noted that these special types of transistors are not needed and regular transistors may readily be used. Likewise, some transistors (e.g., 74, 80, 96, etc.) are coupled directly to the inputs 42, 44 and are shown with thicker gate regions to indicate a thick gate, medium-voltage transistor. Such thicker gate transistors are desirable when connected to I/O pins to accept higher voltage levels than the internal low voltage signals within the circuit.

A wide variety of voltage bias circuits may be used. The exemplary voltage bias circuits 84, 100, include back-to-back diodes and a current-mirrored current source. For example, bias circuit 84 includes diodes 122, 124 and current-mirrored current source 126. In the exemplary voltage bias circuit the diode 122 is intended to track input devices 76 and 78 and so it is the same type of transistor and same length as 76 and 78, and likewise diode 124 is intended to track devices 86 and 88. An inbias voltage is coupled to the gate of transistor 126 and is derived from an external fixed current mirror such that the current through transistor 126 is a mirror of the fixed current generated elsewhere. This fixed current, when flowing through the back-to-back diodes creates a reference voltage (Vcc−Vtn−Vtp) where Vtn is the turn-on voltage of the NMOS transistor 122 and Vtp is the turn-on voltage (magnitude) for the PMOS transistor 124. The output of the voltage bias circuit is applied to the gates of transistors 86, 88 and has the desired effect of limiting the source voltage of transistors 86, 88 to being greater than approximately (Vcc−Vtn). Thus, the purpose of the bias circuit 84, as well as the PMOS devices 86, 88 is to limit the sources of input transistors 78, 76, respectively, to be greater than approximately (Vcc−Vtn). This biases transistors 78, 76 for maximum transconductance and functionality under all conditions where it is needed. Those skilled in the art will recognize that other configurations for voltage bias circuits may be used.

FIG. 6 shows a flowchart of a method for implementing a comparator with a common mode voltage near the voltage rails. In process block 130, an input differential signal is received. The differential signal has a positive V+ input and a negative V− input. In process blocks 132 and 134, one of the differential inputs is applied to a P-type transistor in an input sensing device and another of the differential inputs is applied to an N-type transistor in the same input sensing device. In process block 136, current is sensed that passes through the N- and P-type transistors. Thus, current is sensed that passes through the input sensing device. In process block 138, the sensed current is used, in conjunction with other sensed currents, to generate a digital output.

Having illustrated and described the principles of the illustrated embodiments, it will be apparent to those skilled in the art that the embodiments can be modified in arrangement and detail without departing from such principles.

Although a specific embodiment is shown in FIGS. 4 and 5, there are wide variety of different circuit implementations that can be used to implement the comparator circuit of FIG. 3. For example, the voltage bias circuit could easily be replaced by an active reference to further improve comparator sensitivity, or even a simple voltage source. Other variations are well understood by those skilled in the art.

Additionally, although two sensing devices are shown in each differential amplifier, a different number of sensing devices may be used.

Still further, those skilled in the art will recognize that the Vin− and Vin+ terminals are so labeled because when Vin+ is the higher potential, the output is high (Vcc), and when Vin− is the higher potential then the output is low (gnd).

In view of the many possible embodiments, it will be recognized that the illustrated embodiments include only examples of the invention and should not be taken as a limitation on the scope of the invention. Rather, the invention is defined by the following claims. I therefore claim as the invention all such embodiments that come within the scope of these claims.

I claim:

1. A differential input comparator, comprising:
   a first input terminal and a second input terminal to receive a differential input signal;
   a first differential amplifier having at least two input sensing devices, the input sensing devices having N-type and P-type transistors with one of the transistors having a gate coupled to the first input terminal and the other of the transistors having a gate coupled to the second input terminal;
   a second differential amplifier having at least two input sensing devices, the input sensing devices having N-type and P-type transistors with one of the transistors having a gate coupled to the first input terminal and the other of the transistors having a gate coupled to the second input terminal;
   an output terminal coupled to the first and second differential amplifiers to provide a digital output indicative of the difference in polarity between the first input terminal and the second input terminal; and
   wherein at least one of the differential amplifiers includes a source-following transistor coupled in series with one of the P-type or N-type transistors.

2. The differential input comparator circuit of claim 1, further comprising a current-addition-and-subtraction circuit coupled between the first and second differential amplifiers, the current-addition-and-subtraction circuit receiving two current signals from each differential amplifier and combining the current signals in a predetermined manner.

3. The differential input comparator of claim 1, wherein the first differential amplifier generates currents Ia and Ic and the second differential amplifier generates currents Ib and Id, and further including a current-addition-and-subtraction circuit coupled to the first and second differential amplifiers that performs a mathematical operation according to the formula Ib+Ic−Ia−Id.

4. The differential input comparator of claim 1, wherein the first differential amplifier circuit includes a voltage bias circuit coupled to the input sensing devices within the first differential amplifier.

5. The differential input comparator of claim 1, further including a current-addition-and-subtraction circuit coupled to the first and second differential amplifiers and a current-to-voltage converter coupled to the current-addition-and-subtraction circuit, the comparator output terminal being an output terminal of the current-to-voltage converter.

6. The differential input comparator of claim 5, wherein the current-to-voltage converter includes a voltage gain stage, which is an inverter.

7. The differential input comparator of claim 1, further including a current bias circuit within the first differential amplifier and coupled to the two input sensing devices within the first differential amplifier.

8. A differential input comparator, comprising:
   a first input terminal and a second input terminal to receive a differential input signal;
   at least two input sensing devices that generate at least two currents in response to voltage levels on the first input terminal and the second input terminal, each input sensing device having at least one P-type transistor coupled to one of the input terminals and one N-type transistor coupled to the other input terminal, wherein the currents generated by the sensing devices are used to generate a non-differential single-bit digital output indicative of a difference in polarity between the first input terminal and the second input terminal;
   a voltage bias circuit; and
   a source-following transistor coupled in series with one of the P-type or N-type transistors, the source following transistor having a gate coupled to the voltage bias circuit.

9. The differential input comparator of claim 8, further including a current-addition-and-subtraction circuit coupled to the sensing devices to combine the currents generated by the sensing devices in a predetermined manner.

10. The differential input comparator of claim 9, further including a transresistance amplifier coupled to the current-addition-and-subtraction circuit, the transresistance amplifier providing the digital output.

11. The differential input comparator of claim 10, wherein a voltage gain stage of the transresistance amplifier is an inverter.

12. The differential input comparator of claim 9, wherein there are exactly four sensing devices, each generating one of the currents Ia, Ib, Ic and Id, and wherein the current-addition-and-subtraction circuit combines the currents according to the formula Ib+Ic−Ia−Id.

13. The differential input comparator of claim 8, further including at least one current bias circuit coupled to at least two input sensing devices.

14. The differential input comparator of claim 8, further including two additional input sensing devices, each additional input sensing device having at least one P-type transistor coupled to one of the input terminals and one N-type transistor coupled to the other input terminal.

15. A comparator means for digitizing a differential input signal, comprising:
   means for receiving the differential input signal;
   means for sensing the differential input signal using at least two sensing devices that include P-type and N-type transistors coupled in parallel;
   means for generating currents in the individual sensing devices;
   means for combining the currents to produce a digital output; and
   a source-following transistor coupled in series with one of the P-type or N-type transistors.

16. The comparator means of claim 15, further including voltage biasing means coupled to the sensing devices.

17. The comparator means of claim 15, wherein the generating means includes current biasing means coupled to the sensing devices.

18. A comparator circuit that can sense a differential input polarity with a common mode voltage within 50 millivolts or less of voltage supply rails comprising
   complementary differential amplifiers with combined P-type and N-type transistor pairs coupled in parallel and having gates thereof coupled to opposing polarities of the differential input; and including a source-following transistor coupled in series with one of the P-type or N-type transistors.

19. A differential comparator, comprising:

a first input terminal and a second input terminal to receive a differential input signal;

at least two input sensing devices that generate at least two currents in response to voltage levels on the first and second input terminals;

the input sensing devices having at least one P-type transistor coupled to one of the input terminals and one N-type transistor coupled to the other input terminal, wherein the P-type and N-type transistors are coupled in parallel;

wherein the current generated by the sensing device is used to generate a single-bit digital output indicative of a difference in polarity between the input terminals; and further including a source-following transistor coupled in series with one of the P-type or N-type transistors.

20. The differential comparator of claim 19, wherein there are four input sensing devices and each has at least one P-type transistor coupled to one of the input terminals and one N-type transistor coupled to the other input terminal, wherein the P-type and N-type transistors in each sensing device are coupled in parallel.

21. The differential comparator of claim 19, wherein each input sensing device generates one current and further including a current-addition-and-subtraction circuit that combines the four currents from the input sensing devices in a predetermined manner.

22. A differential input comparator, comprising:

a pair of differential amplifiers each coupled to first and second input terminals and operable to generate current signals corresponding to a difference between inputs signals applied to the input terminals, at least one of the differential amplifiers having a pair of input sensing devices, the input sensing devices having N-type and P-type transistors with a first transistor of one type having a gate coupled to the first input terminal and a first transistor of the other type having a gate coupled to the second input terminal and a source coupled to a source of a second transistor of the one type, the input sensing devices having a source-follower transistor coupled in series with one of the P-type or N-type transistors;

a current-addition-and-subtraction circuit coupled to the first and second differential amplifiers and operable to combine the current signals; and a current-to-voltage converter coupled to the current-addition-and-subtraction circuit and operable to convert the combined current signal into a digital voltage signal.

23. A differential input comparator, comprising:

a first input terminal and a second input terminal to receive a differential input signal;

at least two input sensing devices that generate at least two currents in response to voltage levels on the first input terminal and the second input terminal; and each input sensing device having at least one P-type transistor coupled to one of the input terminals and one N-type transistor coupled to the other input terminal;

wherein the currents generated by the sensing devices are used to generate a single-bit digital output indicative of a difference in polarity between the first input terminal and the second input terminal;

a voltage bias circuit; and a source-following transistor coupled in series with one of the P-type or N-type transistors, the source-following transistor having a gate coupled to the voltage bias circuit.

* * * * *